(12) United States Patent
Mehandru et al.

(10) Patent No.: US 11,557,676 B2
(45) Date of Patent: Jan. 17, 2023

(54) DEVICE, METHOD AND SYSTEM TO PROVIDE A STRESSED CHANNEL OF A TRANSISTOR

(71) Applicant: INTEL CORPORATION, Santa Clara, CA (US)

(72) Inventors: Rishabh Mehandru, Portland, OR (US); Stephen M. Cea, Hillsboro, OR (US); Tahir Ghani, Portland, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/642,335

(22) PCT Filed: Sep. 29, 2017

(86) PCT No.: PCT/US2017/054624
§ 371 (c)(1),
(2) Date: Feb. 26, 2020

(87) PCT Pub. No.: WO2019/066970
PCT Pub. Date: Apr. 4, 2019

(65) Prior Publication Data
US 2021/0083117 A1 Mar. 18, 2021

(51) Int. Cl.
*H01L 29/78* (2006.01)
*H01L 27/088* (2006.01)
*H01L 29/66* (2006.01)

(52) U.S. Cl.
CPC ...... *H01L 29/7849* (2013.01); *H01L 27/0886* (2013.01); *H01L 29/66795* (2013.01)

(58) Field of Classification Search
CPC ........... H01L 29/7849; H01L 29/66795; H01L 29/785; H01L 29/66803; H01L 29/6656; H01L 27/0886
See application file for complete search history.

(56) References Cited

U.S. PATENT DOCUMENTS 9,484,412 B1 * 11/2016 Ando ................. H01L 27/0924
9,490,332 B1 * 11/2016 Balakrishnan ...... H01L 21/2254
(Continued)

FOREIGN PATENT DOCUMENTS

KR     20170028005      3/2017

OTHER PUBLICATIONS

International Preliminary Report on Patentability from PCT/US2017/054624 dated Apr. 9, 2020, 9 pgs.
(Continued)

*Primary Examiner* — Tuan A Hoang
(74) *Attorney, Agent, or Firm* — Essential Patents Group, LLP

(57) ABSTRACT

Techniques and mechanisms to impose stress on a transistor which includes a channel region and a source or drain region each in a fin structure. In an embodiment, a gate structure of the transistor extends over the fin structure, wherein a first spacer portion is at a sidewall of the gate structure and a second spacer portion adjoins the first spacer portion. Either or both of two features are present at or under respective bottom edges of the spacer portions. One of the features includes a line of discontinuity on the fin structure. The other feature includes a concentration of a dopant in the second spacer portion being greater than a concentration of the dopant in the source or drain region. In another embodiment, the fin structure is disposed on a buffer layer, wherein stress on the channel region is imposed at least in part with the buffer layer.

11 Claims, 10 Drawing Sheets

(56) References Cited

U.S. PATENT DOCUMENTS

| | | | |
|---|---|---|---|
| 9,685,334 B1* | 6/2017 | Ke | H01L 21/2257 |
| 2004/0000270 A1* | 1/2004 | Carpenter | C23C 16/4481 |
| | | | 118/723 VE |
| 2005/0112817 A1* | 5/2005 | Cheng | H01L 29/6656 |
| | | | 257/374 |
| 2011/0309333 A1* | 12/2011 | Cheng | H01L 29/78696 |
| | | | 977/762 |
| 2013/0001706 A1* | 1/2013 | Haran | H01L 21/22 |
| | | | 257/E29.255 |
| 2013/0099282 A1 | 4/2013 | Chen et al. | |
| 2014/0252501 A1* | 9/2014 | Cheng | H01L 29/66636 |
| | | | 257/408 |
| 2015/0076603 A1* | 3/2015 | Yin | H01L 27/1203 |
| | | | 257/347 |
| 2015/0263122 A1 | 9/2015 | Hsiao et al. | |
| 2015/0263138 A1* | 9/2015 | Kim | H01L 21/823412 |
| | | | 438/283 |
| 2016/0104799 A1* | 4/2016 | Qi | H01L 29/0673 |
| | | | 257/29 |
| 2016/0359043 A1* | 12/2016 | Chen | H01L 29/66795 |
| 2017/0062588 A1 | 3/2017 | Basker et al. | |
| 2017/0069737 A1 | 3/2017 | Choi et al. | |
| 2017/0077244 A1* | 3/2017 | Chang | H01L 21/26506 |
| 2017/0154995 A1 | 6/2017 | Ontalus | |
| 2018/0108574 A1* | 4/2018 | Li | H01L 21/823814 |

OTHER PUBLICATIONS

International Search Report and Written Opinion from PCT/US2017/054624 dated Jun. 29, 2018, 12 pgs.

Office Action from Taiwanese Patent Application No. 107127458 dated Feb. 15, 2022, 18 pgs.

Notice of Allowance from Taiwanese Patent Application No. 107127458 dated May 17, 2022, 3 pgs.

\* cited by examiner

DEVICE, METHOD AND SYSTEM TO PROVIDE A STRESSED CHANNEL OF A TRANSISTOR

CLAIM OF PRIORITY

This Application is a National Stage Entry of, and claims priority to, PCT Application No. PCT/US17/54624, filed on 29 Sep. 2017 and titled "DEVICE, METHOD AND SYSTEM TO PROVIDE A STRESSED CHANNEL OF A TRANSISTOR", which is incorporated by reference in its entirety for all purposes.

BACKGROUND

1. Technical Field

Embodiments of the invention relate generally to semiconductor technology and more particularly, but not exclusively, to stressed transistors.

2. Background Art

In semiconductor processing, transistors are typically formed on semiconductor wafers. In CMOS (complimentary metal oxide semiconductor) technology, transistors usually belong to one of two types: NMOS (negative channel metal oxide semiconductor) or PMOS (positive channel metal oxide semiconductor) transistors. The transistors and other devices may be interconnected to form integrated circuits (ICs) which perform numerous useful functions.

Operation of such ICs depends at least in part on the performance of the transistors, which in turn can be improved by an imposition of stress in channel regions. Specifically, performance of a NMOS transistor is improved by providing a tensile stress in its channel region, and performance of a PMOS transistor is improved by providing a compressive stress in its channel region.

A FinFET is a transistor built around a thin strip of semiconductor material (generally referred to as the fin). The transistor includes the standard field effect transistor (FET) nodes, including a gate, a gate dielectric, a source region, and a drain region. The conductive channel of such a device is provided at an outer side of the fin beneath the gate dielectric. Specifically, current runs along/within both sidewalls of the fin (sides perpendicular to the substrate surface) as well as along the top of the fin (side parallel to the substrate surface). Because the conductive channel of such configurations essentially resides along three different outer, planar regions of the fin, such a FinFET design is sometimes referred to as a trigate FinFET. Other types of FinFET configurations are also available, such as so-called double-gate FinFETs, in which the conductive channel principally resides only along the two sidewalls of the fin (and not along the top of the fin). There are a number of non-trivial issues associated with fabricating such fin-based transistors.

BRIEF DESCRIPTION OF THE DRAWINGS

The various embodiments of the present invention are illustrated by way of example, and not by way of limitation, in the figures of the accompanying drawings and in which.

DETAILED DESCRIPTION

In various embodiments, apparatuses and methods relating to stressed transistors are described. Briefly, some embodiments variously promote channel stress to enhance the performance of one or more NMOS transistors and/or one or more PMOS transistors. However, various embodiments may be practiced without one or more of the specific details, or with other methods, materials, or components. In other instances, well-known structures, materials, or operations are not shown or described in detail to avoid obscuring aspects of various embodiments. Similarly, for purposes of explanation, specific numbers, materials, and configurations are set forth in order to provide a thorough understanding of some embodiments. Nevertheless, some embodiments may be practiced without specific details. Furthermore, it is understood that the various embodiments shown in the figures are illustrative representations and are not necessarily drawn to scale.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, embodiments may be employed in any of a variety of electronic devices including one or more transistors including structures formed according to techniques described herein.

Figure 1:
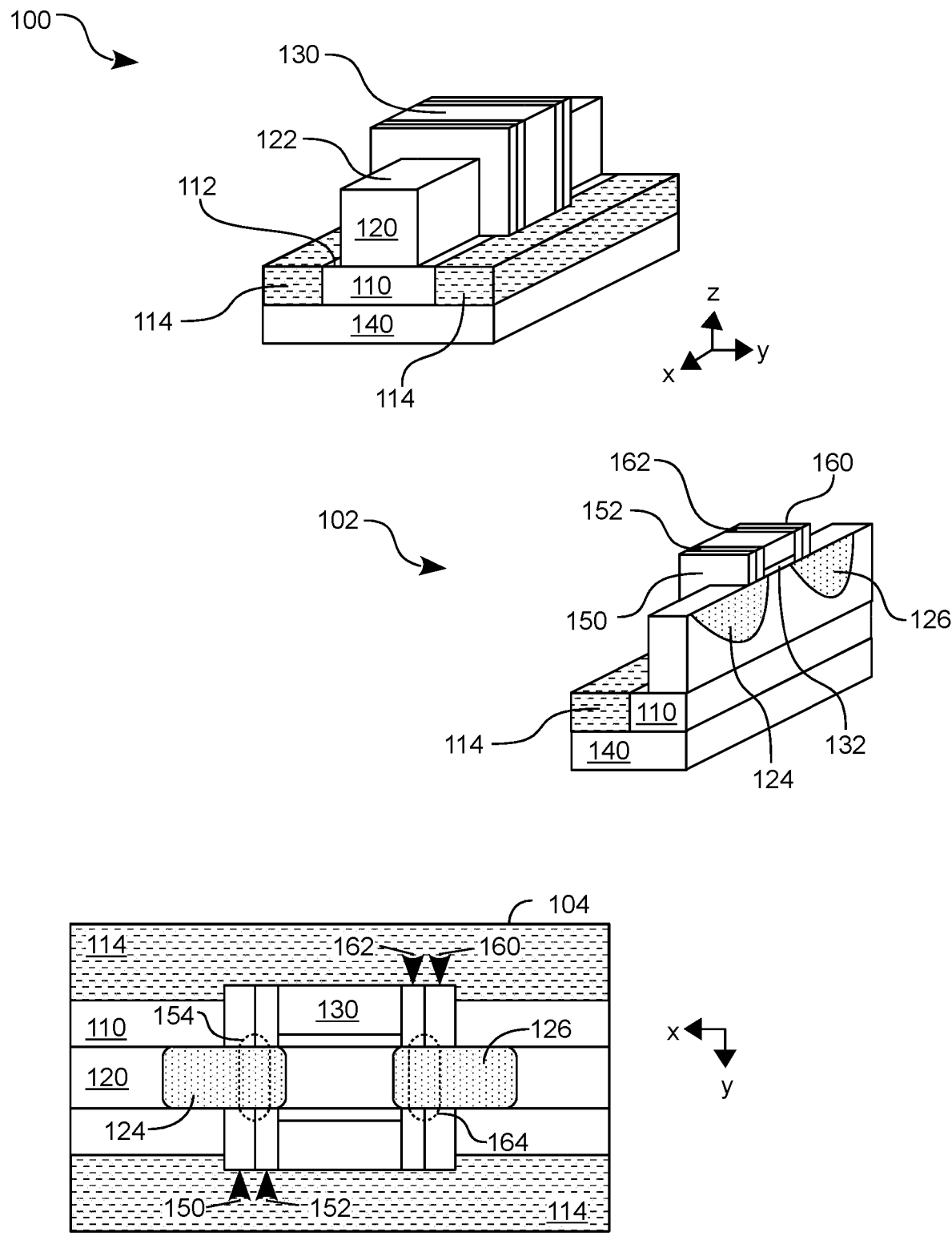
FIG. 1 shows various views illustrating elements of an integrated circuit to promote transistor stress according to an embodiment.

FIG. 1 shows in perspective view an integrated circuit (IC) device 100 including structures to impose stress on a transistor according to an embodiment. FIG. 1 also shows a cut-away perspective view 102 and a top plan view 104 of IC device 100.

IC device 100 is one example of an embodiment wherein structures of a transistor include indicia of a fabrication processes wherein spacer structures are successively formed on a given side of a gate electrode. Such a transistor may include doped source or drain regions of a fin structure, as well as gate structures—e.g., including a gate dielectric and a gate electrode—which extend over the fin structure. The fin structure may be formed by a first semiconductor body which is disposed on a second semiconductor body (referred to herein as a "buffer layer") that is to facilitate an imposition of stress on the transistor. Use of a doped spacer structure and/or a multi-stage doping process may mitigate the need for alternative fabrication processes that could otherwise mitigate such stress.

In the example embodiment shown, IC device 100 includes a buffer layer 110 having a side 112. Buffer layer 110 may comprise one or more epitaxial single crystalline semiconductor layers (e.g., silicon, germanium, silicon germanium, gallium arsenide, indium phosphide, indium gallium arsenide, aluminum gallium arsenide, etc.) which—for example—may be grown atop a different bulk semiconductor substrate (such as the illustrative silicon substrate 140 shown).

Although some embodiments are not limited in this regard, buffer layer 110 may comprise various epitaxially grown semiconductor sub-layers having different lattice constants. Such semiconductor sub-layers may serve to grade the lattice constant along the z-axis of the xyz coordinate system shown. For example, a germanium concentration of the SiGe buffer layers 110 may increase from 30% germanium at the bottom-most buffer layer to 70% germanium at the top-most buffer layer, thereby gradually increasing the lattice constant.

IC device 100 may further include on buffer layer 110 a first semiconductor body which forms a fin structure (such as the illustrative fin structure 120 shown). For example, the first semiconductor body may be formed in part from an epitaxially grown single crystalline semiconductor such as, but not limited to Si, Ge, GeSn, SiGe, GaAs, InSb, GaP, GaSb, InAlAs, InGaAs, GaSbP, GaAsSb, GaN, GaP, and InP. Fin structure 120 may extend to side 112, in some embodiments. In other embodiments, the first semiconductor body may further comprise an underlying sublayer portion from which fin structure 120 extends (e.g., where the underlying sublayer portion is disposed between, and adjoins each of, side 112 and fin structure 120).

As used herein, "source or drain region" (or alternatively, "source/drain region") refers to a structure which is configured to function as one of a source of a transistor or a drain of a transistor. Doped portions of fin structure 120 may provide a source of a transistor and a drain of the transistor (such as the illustrative source/drain regions 124, 126 shown). A channel region of the transistor may be disposed between source/drain regions 124, 126, wherein a gate dielectric 132 and a gate electrode 130 variously extend over a portion of fin structure 120 which includes the channel region. For example, source/drain regions 124, 126 regions may extend under laterally opposite sides of gate electrode 130.

Source/drain regions 124, 126 and the channel region may be configured to conduct current during operation of IC device 100—e.g., the current controlled using gate electrode 130. For example, source/drain regions 124, 126 may be disposed in a source/drain well which is formed with fin structure 120. Source/drain regions 124, 126 may include any of a variety of suitable n-type dopants, such as one of phosphorus or arsenic. Alternatively, source/drain regions 124, 126 may include any of various suitable p-type dopant, such as boron.

Structures of buffer layer 110 and/or structures of fin structure 120 may be electrically isolated at least in part, by insulation structures 114 (for example), from other circuit structures of IC device 100. Insulation structures 114 may include silicon dioxide or any of a variety of other dielectric materials adapted, for example, from conventional isolation techniques. The sizes, shapes, number and relative configuration of insulation structures 114 are merely illustrative, and IC device 100 may include any of a variety of additional or alternative insulation structures, in other embodiments.

Gate dielectric 132 may include a high-k gate dielectric, such as hafnium oxide. In various other embodiments, gate dielectric 132 may include hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobate. In another embodiment, gate dielectric 132 includes silicon dioxide.

Gate electrode 130 may be formed of any suitable gate electrode material. In an embodiment, gate electrode 130 comprises a doped polycrystalline silicon. Alternatively or in addition, gate electrode 130 may comprise a metal material, such as but not limited to tungsten, tantalum, titanium and their nitrides. It is to be appreciated that gate electrode 130 need not necessarily be a single material and may be a composite stack of thin films, such as but not limited to a polycrystalline silicon/metal electrode or a metal/polycrystalline silicon electrode.

Although some embodiments are not limited in this regard, the transistor may include multiple distinct channel regions each between source/drain regions 124, 126—e.g., the multiple channel regions including one or more nanowire structures. Such one or more nanowires may, for example, be formed of any of various suitable materials such as, but not limited to Si, Ge, SiGe, GaAs, InSb, GaP, GaSb, InAlAs, InGaAs, GaSbP, GaAsSb, InP, and carbon nanotubes.

In an embodiment, the first semiconductor body which forms fin structure 120 may have a crystalline structure other than that of the adjoining buffer layer 110. A mismatch (e.g., the lattice constant mismatch) between fin structure 120 and side 112 may result in a compressive stress or tensile stress being imposed in a channel region which is between source/drain regions 124, 126. For example, a lattice constant of side 112 may be different from the lattice constant of fin structure 120. In one such embodiment, one of side 112 and fin structure 120 comprises silicon germanium having a first silicon-to-germanium component ratio, where the other of side 112 and fin structure 120 comprises pure silicon or silicon germanium having a second silicon-to-germanium component ratio other than the first silicon-to-germanium component ratio. However, any of various other lattice mismatches may be provided with 110 and fin structure 120, in different embodiments.

Conventional fabrication of non-planar transistor devices often includes an epi undercut process to form recesses into which doped source/drain regions are subsequently grown. However, significant amounts of stress between fin structure 120 and side 112 might otherwise be relieved by such an epi undercut process. Various embodiments may mitigate or avoid the loss of such stress with improved techniques for forming doped source/drain regions—e.g., where such techniques forego the need for cutting away and replacing portions of fin structure 120.

IC device 100 may include one or more artifacts of such improved techniques—the one or more artifacts including features which are formed by or disposed under spacer structures on at least one side of gate electrode 130. By way of illustration and not limitation, a spacer portion 152 may adjoin a sidewall of gate electrode 130, wherein another spacer portion 150 adjoins spacer portion 152. In such an embodiment, either or both of two features may be present in a region 154 which includes, or is disposed under, respective bottom edges of spacer portions 150, 152. One such feature includes a line of discontinuity being formed on fin structure 120 at an interface of spacer portions 150, 152. Such a line of discontinuity may be formed at least in part by a top side 122 of fin structure 120 and/or by other structures (e.g., including spacer portions 150, 152) which are disposed on side 122. The other feature includes spacer portion 150 and source/drain region 124 each having respective amounts of a dopant, wherein a concentration of the dopant in spacer portion 150 is greater than a concentration of the dopant in source/drain region 124.

Alternatively or in addition, a spacer portion 162 may adjoin an opposite sidewall of gate electrode 130, wherein another spacer portion 160 adjoins spacer portion 162. In such an embodiment, either or both of two features may be present in the region 164 shown. One such feature includes a line of discontinuity being formed on fin structure 120 at an interface of spacer portions 160, 162. The other feature includes spacer portion 160 and source/drain region 124 each having respective amounts of a dopant, wherein a concentration of the dopant in spacer portion 160 is greater than a concentration of the dopant in source/drain region 124.

Figure 2:
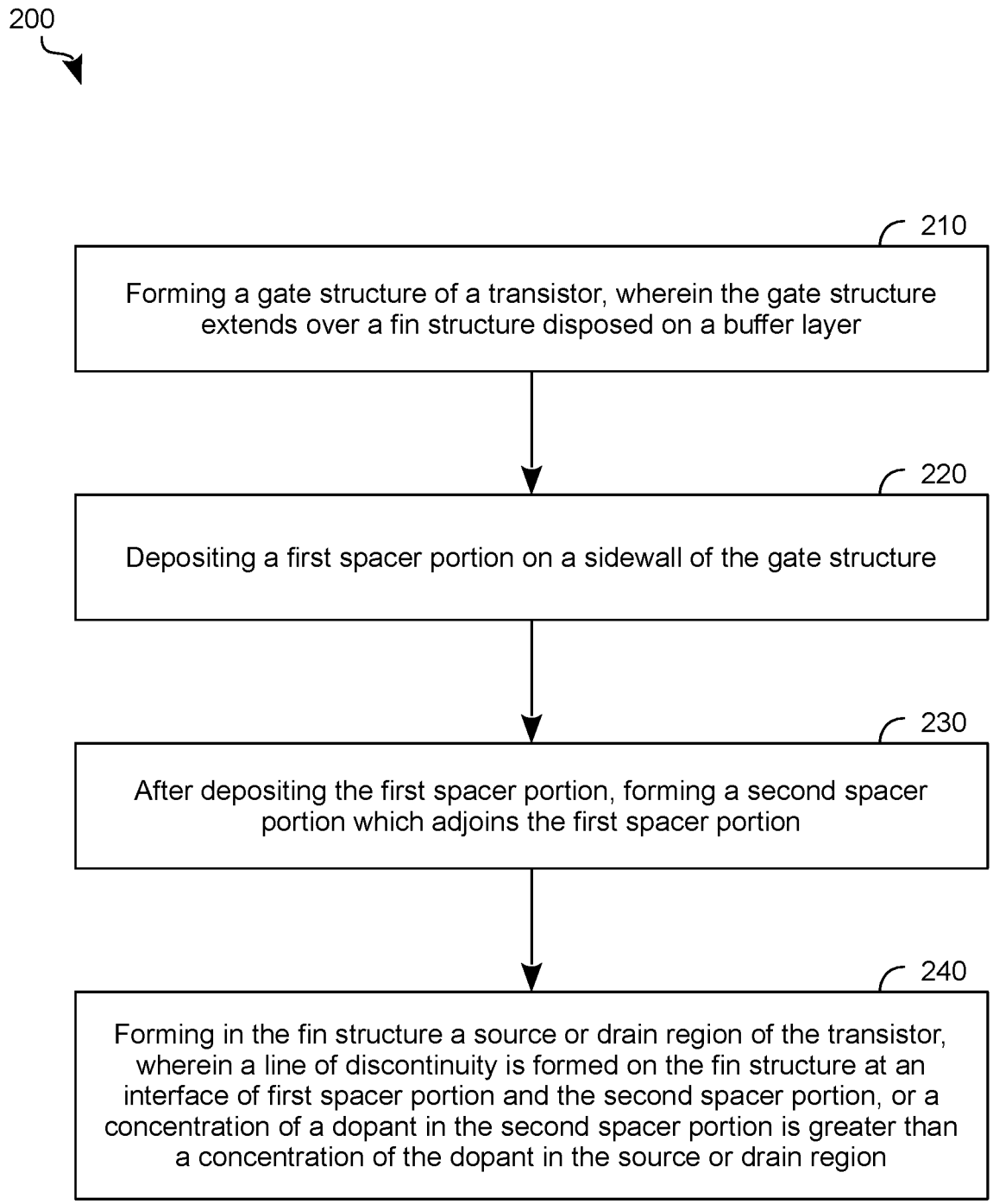
FIG. 2 is a flow diagram illustrating elements of a method for promoting stress in a channel of a transistor according to an embodiment.

FIG. 2 shows features of a method 200 to provide a stressed channel region of a transistor according to an embodiment. Method 200 may include processes to fabricate some or all of the structure of IC device 100, for example. To illustrate certain features of various embodiments, method 200 is described herein with reference to structures shown in FIGS. 3A, 3B. However, any of a variety of additional or alternative structures may be fabricated according to method 200, in different embodiments.

Figure 3A:
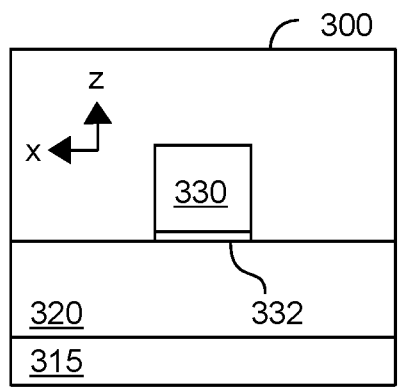
FIGS. 3A, 3B show cross-sectional views each illustrating structures at a respective stage of semiconductor fabrication processing according to an embodiment.
Figure 3A:
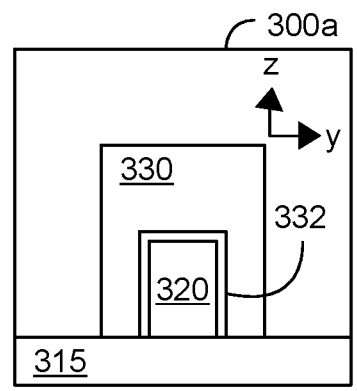
Figure 3A:
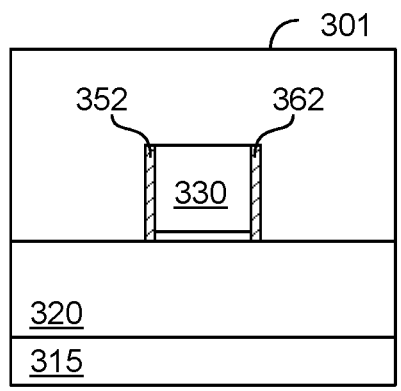
Figure 3A:
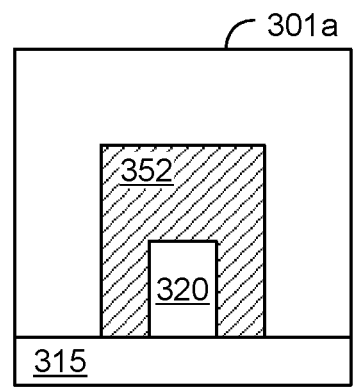
Figure 3A:
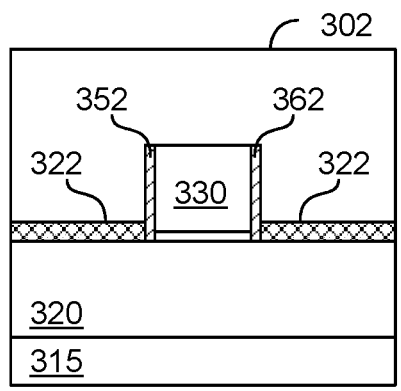
Figure 3A:
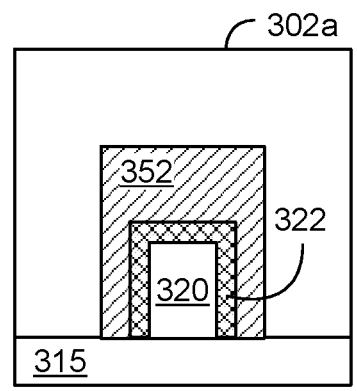
Figure 3B:
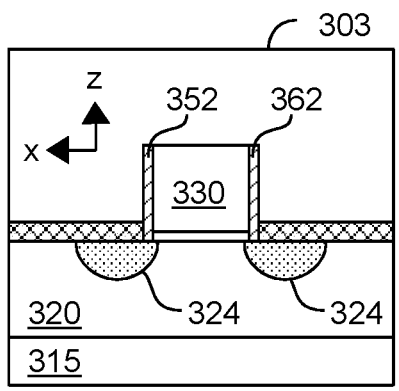
Figure 3B:
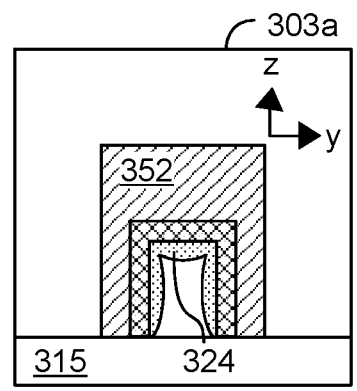
Figure 3B:
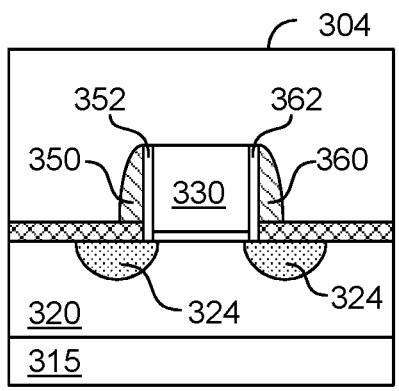
Figure 3B:
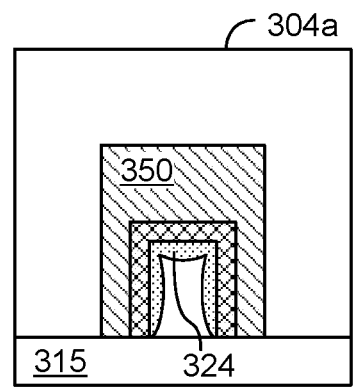
Figure 3B:
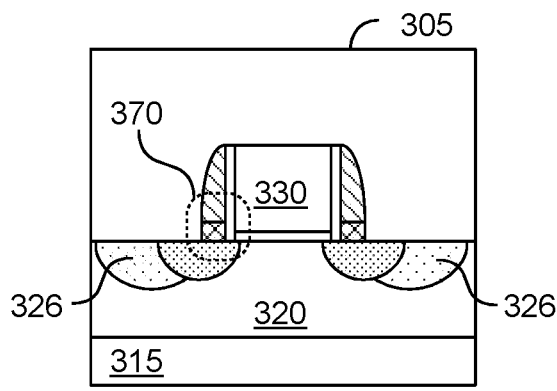
Figure 3B:
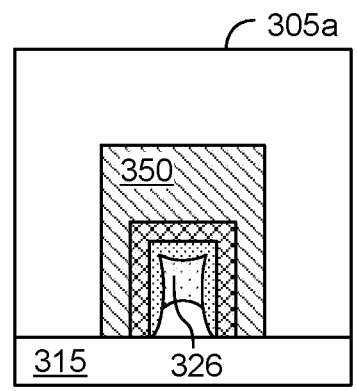

As shown in FIG. 2, method 200 may include, at 210, forming a gate structure of a transistor, wherein the gate structure extends over a fin structure disposed on a buffer layer. For example, as shown in FIG. 3A at stage 300, a fin structure 320 may be disposed directly or indirectly on a buffer layer 315—e.g., where fin structure 320 and buffer layer 315 correspond functionally to fin structure 120 and buffer layer 110, respectively. A gate dielectric 332 and a gate electrode 330 may be selectively formed, in sequence, each to extend at least partially around fin structure 320. Such selective formation may include operations adapted from conventional semiconductor fabrication techniques—e.g., including mask, lithography, deposition (e.g., chemical vapor deposition), etching and/or other processes—which are not detailed herein to avoid obscuring certain features of various embodiments.

Method 200 may further comprise, at 220, depositing a first spacer portion on a sidewall of the gate structure. For example, as shown at stage 301, one or both of spacer portions 352, 362 may be formed—e.g., each at a respective one of two opposite sidewalls of gate electrode 330. Spacers 352, 362 may be formed by blanket depositing a conformal dielectric film, such as, but not limited to, silicon nitride, silicon oxide, silicon oxynitride or combinations thereof. A dielectric material of spacers 352, 362 may be deposited in a conformal manner so that the dielectric film forms to substantially equal heights on vertical surfaces, such as the sidewalls of gate electrode 330. In one exemplary embodiment, the dielectric film is a silicon nitride film formed by a hot-wall low-pressure chemical vapor deposition (LPCVD) process. The deposited thickness of the dielectric film may determine the width or thickness of the formed spacers 352, 362. In an embodiment, the thickness of one of spacer portions 352, 362 may facilitate isolation of gate electrode 330 during subsequent doping processes. In one example embodiment, such a dielectric film is formed to a thickness (x-axis dimension) in a range of 0.5 nanometers (nm) to 15 nm—e.g., wherein the thickness is in a range of 0.5 nm to 5 nm and, in some embodiments, a range of 1 nm to 3 nm.

In an embodiment, method 200 further comprises, after depositing the first spacer portion, forming (at 230) a second spacer portion which adjoins the first spacer portion. Method 200 may further comprise, at 240, forming in the fin structure a source/drain region of the transistor. A line of discontinuity may be formed on the fin structure at an interface of the first spacer portion and the second spacer portion. Alternatively or in addition, the second spacer portion and the source/drain region may each include a dopant, wherein a concentration of the dopant in the second spacer portion is greater than a concentration of the dopant in the source/drain region.

The forming of the source/drain region at 240 may, for example, comprise forming a doped layer (e.g., including doped epi a doped glass) on the fin structure, where said forming is performed after depositing the first spacer portion at 220. In such an embodiment, forming of the source/drain region at 240 may further comprise performing an indiffusion (before forming the second spacer portion at 230) from the doped layer into the fin structure. For example, as shown at stage 302, a layer 322 of a doped epitaxial material (or alternatively, a doped glass) may be conformally grown around fin structure 320. A dopant of layer 322 may be subsequently indiffused into fin structure 320 an annealing process done, for example, at a relatively low temperature (650° C. to 800° C.) or at higher temperatures (e.g., up to 1200° C.) such as in cases of rapid thermal anneal (RTA) or flash annealing processes. However, ranges of possible annealing temperatures are not limiting on some embodiments, and may vary according to implementation-specific details.

As shown at stage 304, annealing to provide indiffusion from layer 322 may result in one or both of the illustrative doped regions 324 being formed—e.g., each at (and in some embodiments, partially under) a respective one of two opposite ends of gate dielectric 332. For example, one or both of doped regions 324 may include any suitable n-type dopants, such as phosphorus and arsenic. Alternatively, one or both of doped regions 324 may include a p-type dopant, such as boron.

In such an embodiment, the forming of the second spacer portion at 230 may include, after formation of one or both doped regions 324, depositing one or both of two additional spacer portions 350, 360—e.g., each on a respective one of two opposite sides of gate electrode 330. Spacer portion 350 may adjoin spacer portion 352 and/or spacer portion 360 may adjoin spacer portion 362, for example. In such an embodiment, the formation of the source or drain region at 240 may further comprise performing additional doping of fin structure 320 (e.g., including ion implantation, plasma implantation or indiffusion) after formation of the second spacer portion at 230 and—in some embodiments—after etching to remove at least part of doped layer 322. As shown at stage 305, one or both of doped regions 326 may be formed by such additional doping—e.g., wherein one of doped regions 326 includes one of doped regions 324 or forms a source/drain region in combination with one of doped regions 324. In such an embodiment, one of the doped regions 324 may be a tip portion of a source/drain region. One or more insulation structures (not shown)—e.g., including insulation structures 114—may be formed during or after stages 300-305, in some embodiments.

A thickness (along the x-axis shown) of one of spacer portions 350, 360—e.g., in combination with that of an adjoining one of spacer portions 352, 362—may be sufficient to protect an adjoining sidewall of gate electrode 330 from such additional doping processes. By way of illustration and not limitation, a spacer including spacer portions 350, 352 (or including spacer portions 360, 362) may have a thickness which is in a range of 0.5 nm to 10 nm.

The processing illustrated by stages 300-305 may result in a structure—referred to herein as a "line of discontinuity"—which extends along a width (y-axis dimension) of fin structure 320. Such a line of discontinuity may form the edge of a depression of at least 0.5 nm in (z-axis) height.

In the example embodiment, such a line of discontinuity (e.g., at region 370) may be formed by respective bottom edges of spacer portions 350, 352—e.g., wherein the line of discontinuity defines at least in part a recess in which a bottom side of spacer portion 352 is disposed. Alternatively or in addition, another line of discontinuity may be formed by respective bottom edges of spacer portions 360, 362—e.g., wherein the line of discontinuity defines at least in part a recess in which a bottom side of spacer portion 362 is disposed.

In an alternative embodiment, some or all of doped layer 322 may be etched away prior to formation of spacer portions 350, 360. In such an embodiment, a different line of discontinuity may instead be formed in region 370. For example, etching away of doped layer 322 may result in an etching artifact which removes a top portion of fin structure 320. As a result, the subsequently deposited spacer portion 350 would have a bottom edge—across the (y-axis) width of fin structure 320—which is lower than the corresponding bottom edge of spacer portion 352 across the width of fin structure 320. Alternatively or in addition, the subsequently deposited spacer portion 360 would have a bottom edge—across the (y-axis) width of fin structure 320—which is lower than the corresponding bottom edge of spacer portion 362 across the width of fin structure 320. Accordingly, a line of discontinuity may be formed by respective bottom edges of spacer portions 350, 352—e.g., wherein the line of discontinuity defines at least in part a recess in which a bottom side of spacer portion 350 is disposed. Alternatively or in addition, another line of discontinuity may be formed by respective bottom edges of spacer portions 360, 362—e.g., wherein the line of discontinuity defines at least in part a recess in which a bottom side of spacer portion 360 is disposed.

Figure 4A:
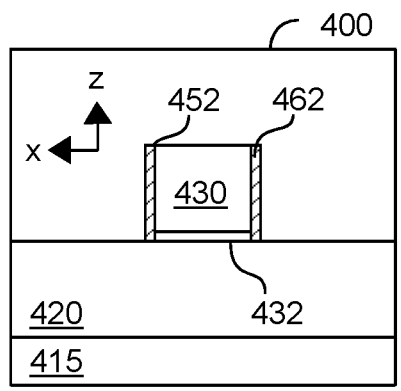
FIGS. 4A, 4B show cross-sectional views each illustrating structures at a respective stage of semiconductor fabrication processing according to an embodiment.
Figure 4A:
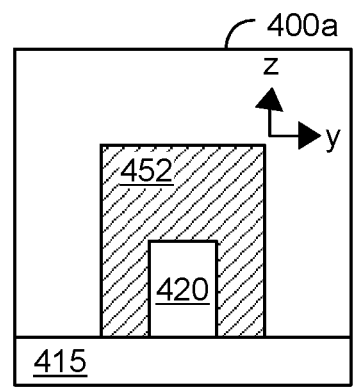
Figure 4A:
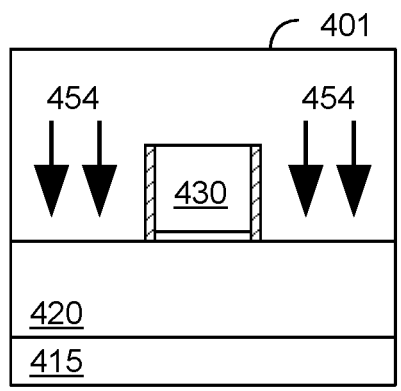
Figure 4A:
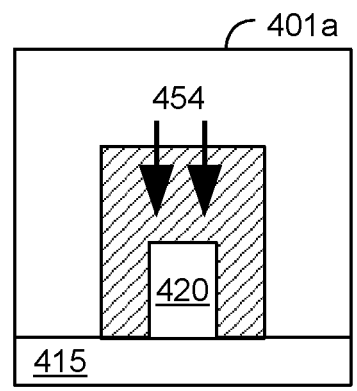
Figure 4A:
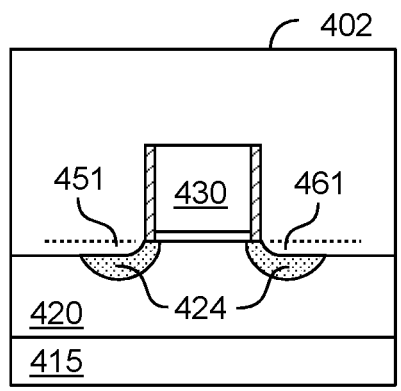
Figure 4A:
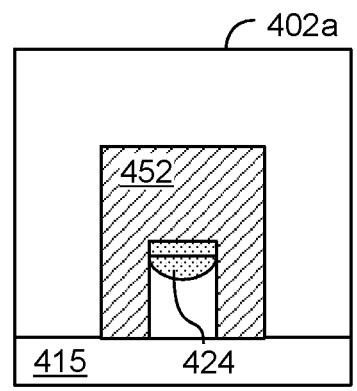
Figure 4B:
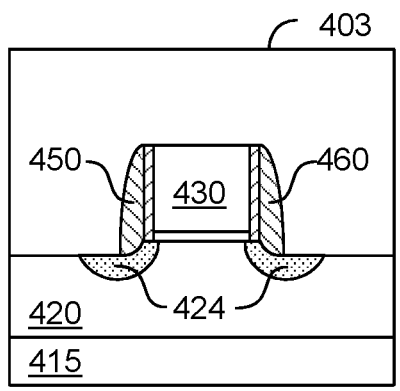
Figure 4B:
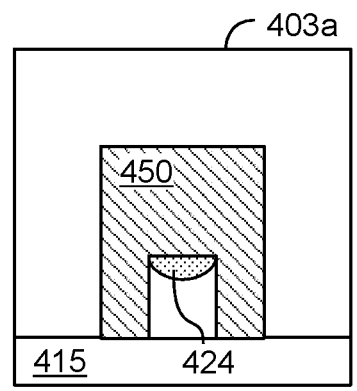
Figure 4B:
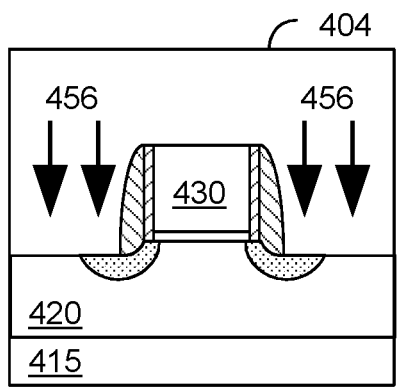
Figure 4B:
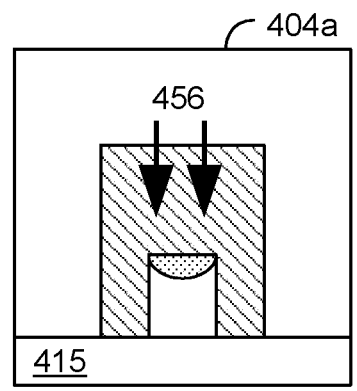
Figure 4B:
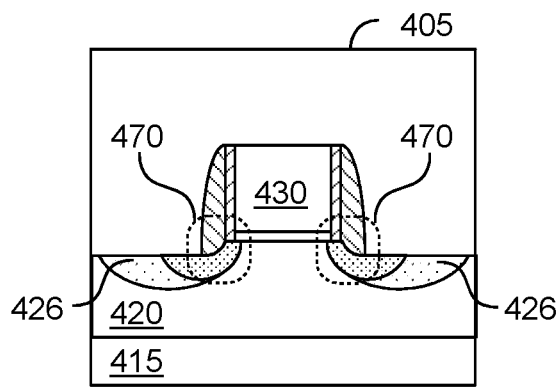
Figure 4B:
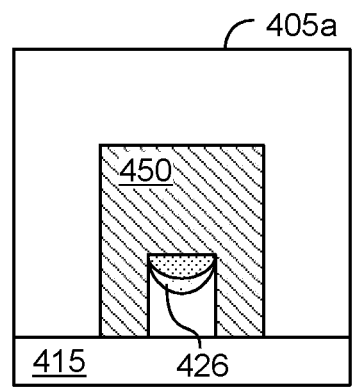

In some embodiments, the forming of a source/drain region at 240 includes performing an ion implantation or a plasma implantation of the fin structure, where said implantation is performed after deposition of the first spacer portion at 220 and before formation of the second spacer portion at 230. For example, referring now to FIGS. 4A, 4B, cross-sectional side views are shown for respective stages 400-405 of processing to fabricate transistor structures according to an embodiment. FIGS. 4A, 4B also show cross-sectional end views 400a-405a corresponding to stages 400-405, respectively.

At stage 400, a fin structure 420 may be disposed directly or indirectly on a buffer layer 415—e.g., where fin structure 420 and buffer layer 415 functionally correspond to fin structure 120 and buffer layer 110, respectively. A gate dielectric 432 and a gate electrode 430 may each extend at least partially around fin structure 420. In some embodiments, one or both of the illustrative spacer portions 452, 462 may be formed—e.g., each at a respective one of two opposite sidewalls of gate electrode 430. The structures shown at stage 400 may, for example, variously include features of corresponding structures shown in stage 301.

At stage 401, an implantation 454 of fin structure 420 may be performed—e.g., as part of the forming of a source/drain region at 240. Implantation 454 may include ion implantation processing and/or plasma implantation processing—e.g., wherein implantation 454 is performed at an offset angle from the z-axis shown and dopes fin structure 420 at least in part through a sidewall thereof. As shown at stage 402, doped regions 424 may be formed in fin structure 420 by the implantation 454. In some embodiments, implantation 454 is corrosive to part of fin structure 320. For example, one or more recesses (such as the illustrative recesses 451, 461 shown) may be formed by implantation 454 removing top portions of fin structure 420. Such one or more recesses may extend each to a respective one of spacer portions 452, 462—e.g., wherein a line of discontinuity is formed at an end of one such recess by a remaining portion of fin structure 120 under said spacer portion. One or each of recesses 451, 461 may, for example, have a (z-axis) height of at least 0.5 nm.

As shown at stage 403, one or more other spacer portions (such as the illustrative spacer portions 450, 460) may be formed each alongside a respective one of spacer portions 452, 462. Spacer portion 450 and/or spacer portion 460 may, for example, be deposited by the forming at 230 of method 200. At stage 404, an additional doping 456 of fin structure 420 may be performed—e.g., as part of the forming of the source/drain region at 240. Implantation 456 may include any of a variety of implantation processes or indiffusion processes, for example. As shown at stage 405, one or both of doped regions 426 may be formed by the additional doping 456—e.g., wherein one of doped regions 426 includes one of doped regions 424 or, alternatively, forms a source/drain region in combination with one of doped regions 424. One or more insulation structures (not shown)—e.g., including insulation structures 114—may be formed during or after stages 400-405, in some embodiments.

The forming of the second spacer portion, at 220 of method 200, may include (for example) depositing on the fin structure a doped glass material which includes a first dopant. In such an embodiment, forming the source or drain region (at 240 of method 200) may include performing an indiffusion from the doped glass material into the fin structure.

Figure 5A:
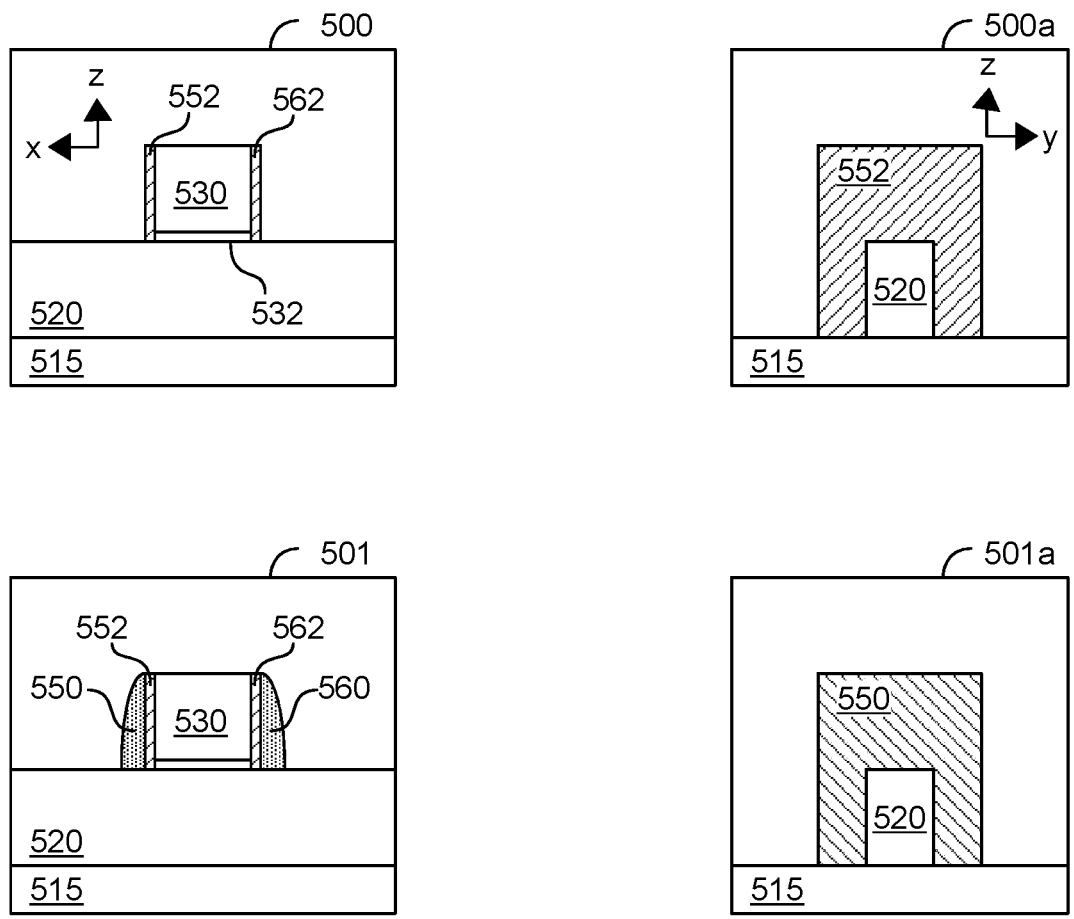
FIGS. 5A, 5B show cross-sectional views each illustrating structures at a respective stage of semiconductor fabrication processing according to an embodiment.
Figure 5B:
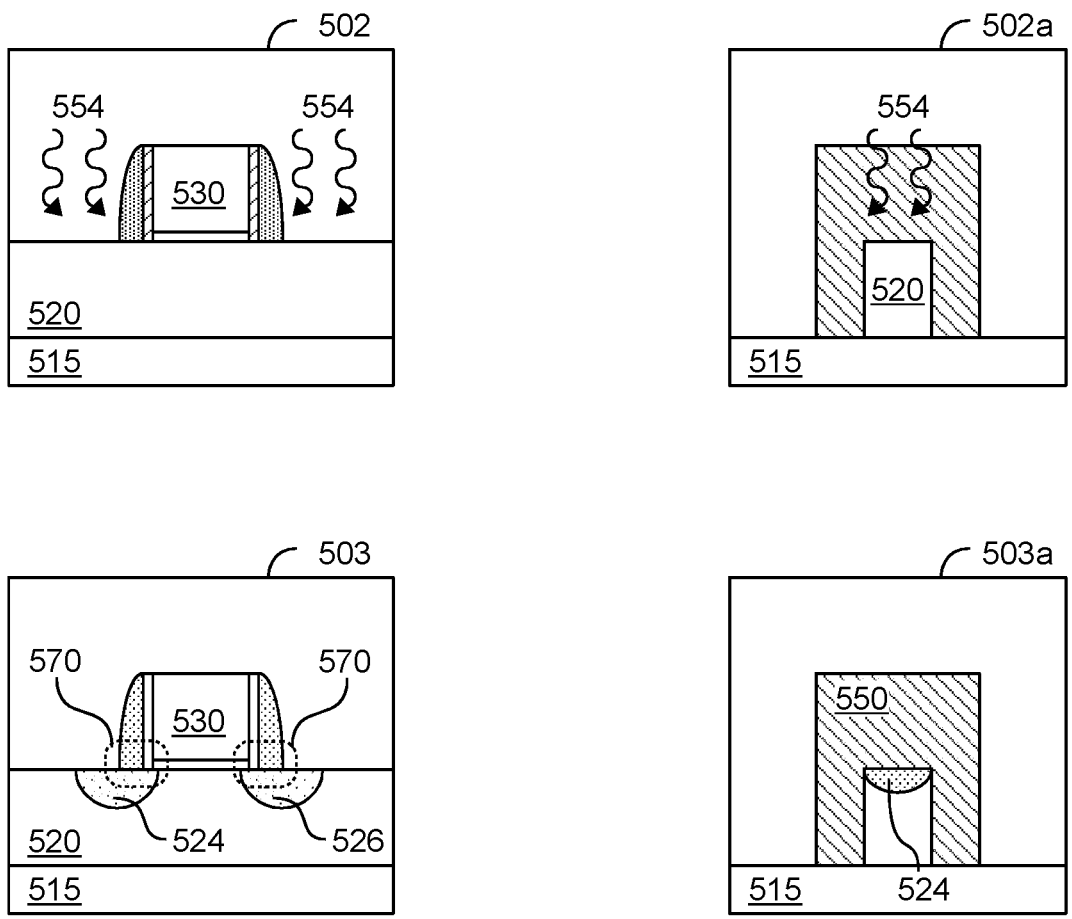

For example, referring now to FIGS. 5A, 5B, cross-sectional side views are shown for respective stages 500-503 of processing to fabricate transistor structures according to an embodiment. FIGS. 5A, 5B also show cross-sectional end views 500a-503a corresponding to stages 500-503, respectively. Although respective structures are variously shown in FIGS. 3A, 3B, 4A, 4B, 5A and 5B as being rectilinear, it is to be appreciated that some or all such features—e.g., including horizontal top or bottom surfaces, sidewalls, corners, etc.—may be variously angled, curved, tapered, roughened or the like, in different embodiments.

At stage 500, a fin structure 520 may be disposed directly or indirectly on a buffer layer 515—e.g., where fin structure 520 and buffer layer 515 functionally correspond to fin structure 120 and buffer layer 110, respectively. A gate dielectric 532 and a gate electrode 530 may each extend at least partially around fin structure 520. In some embodiments, one or both of the illustrative spacer portions 552, 562 may be formed—e.g., each at a respective one of two opposite sidewalls of gate electrode 530. The structures shown at stage 500 may, for example, variously include features of corresponding structures shown in stage 301.

As shown at stage 501, one or more other doped spacer portions (such as the illustrative spacer portions 550, 560) may be formed each alongside a respective one of spacer portions 552, 562. A doped glass material of spacer portion 550 and/or spacer portion 560 may, for example, be deposited by the forming at 230 of method 200. In an embodiment, the thickness of one of spacer portions 552, 562 may facilitate isolation of gate electrode 530 during subsequent doping processes. In one example embodiment, such a thickness (x-axis dimension) is in a range of 0.5 nm to 8 nm and, in some embodiments, a range of 1 nm to 3 nm.

As shown at state 502, an doping 554 of fin structure 520 may be performed—e.g., as part of the forming of a source/drain region at 240—after one or each of spacer portions 550, 560 has been formed. Doping 554 may include an annealing process to indiffuse a dopant of one or each of spacer portions 550, 560 into fin structure 520. As shown at stage 503, a doped region 524 under spacer portion 550 (and/or a doped region 526 under spacer portion 560) may be formed in fin structure 520 by the doping 554. In such an embodiment, a concentration of the dopant in spacer portion 550 may be more than a concentration of that same dopant in doped region 524. Alternatively or in addition, a concentration of the dopant in spacer portion 560 may be more than a concentration of that same dopant in doped region 526. Doped regions 524, 526 may function each as a respective source or drain region of a transistor which includes gate electrode 530.

Figure 6:
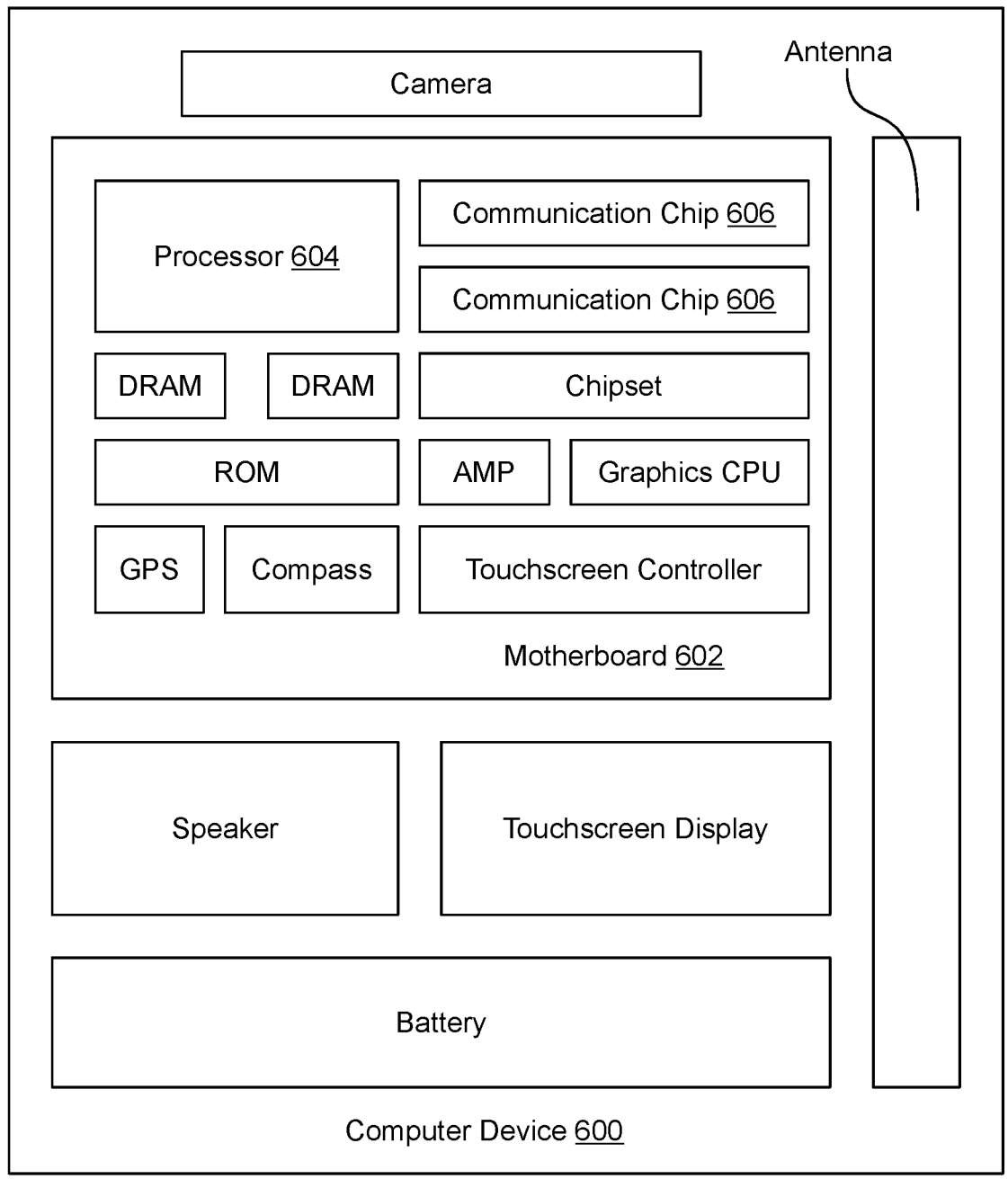
FIG. 6 is a functional block diagram illustrating a computing device in accordance with one embodiment.

FIG. 6 illustrates a computing device 600 in accordance with one embodiment. The computing device 600 houses a board 602. Integrated circuitry of computing device 600 may include one or more transistors which are stressed according to techniques described herein. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). A display device of computing device 600 may be coupled to display an image based on one or more signals which are communicated with circuit structures having features described herein.

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
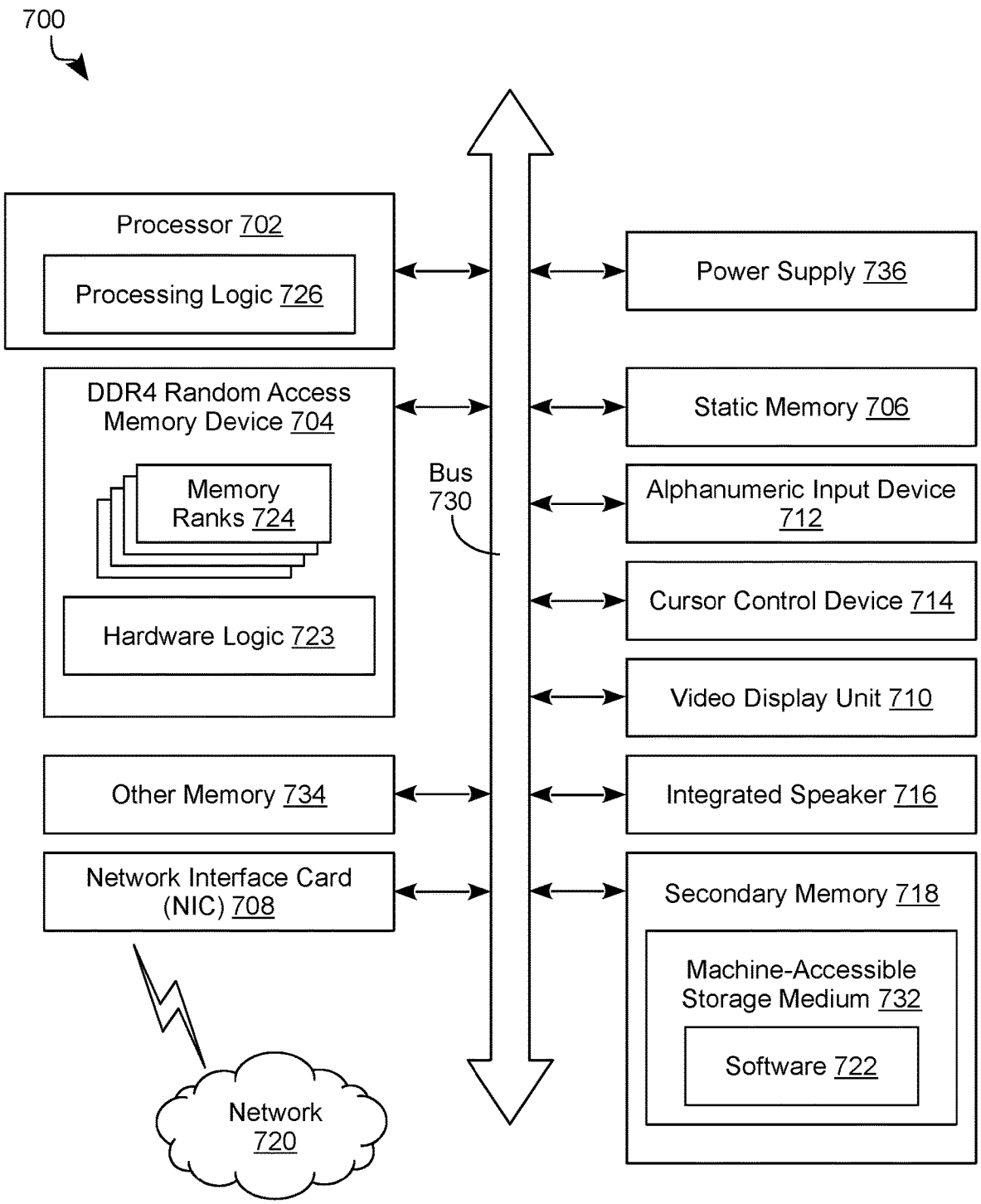
FIG. 7 is a functional block diagram illustrating an exemplary computer system, in accordance with one embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker). Video display unit 710 may be coupled to display an image based on one or more signals which are communicated with circuit structures having features described herein.

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, an integrated circuit (IC) device comprises a buffer layer including a semiconductor lattice, a fin structure disposed on the buffer layer, the fin structure including a channel region of a transistor and a source or drain region of the transistor, wherein a stress is imposed on the channel region with the buffer layer, a gate structure of the transistor, wherein the gate structure extends over the fin structure, a first spacer portion disposed on a sidewall of the gate structure, and a second spacer portion adjoining the first spacer portion. A line of discontinuity is formed on the fin structure at an interface of the first spacer portion and the second spacer portion, or the second spacer portion and the source or drain region each include a dopant, wherein a concentration of the dopant in the second spacer portion is greater than a concentration of the dopant in the source or drain region.

In an embodiment, the surface of the fin structure forms the line of discontinuity, wherein the line of discontinuity defines at least in part a recess portion under the first spacer portion. In another embodiment, the surface of the fin structure forms the line of discontinuity, wherein the line of discontinuity defines at least in part a recess portion under the second spacer portion. In another embodiment, the concentration of the dopant in the second spacer portion is greater than the concentration of the dopant in the source or drain region, and the line of discontinuity is formed on the fin structure at the interface.

In another embodiment, the line of discontinuity is formed on the fin structure at the interface of the first spacer portion and the second spacer portion, or a concentration of a dopant in the second spacer portion is greater than a concentration of the dopant in the source or drain region. In another embodiment, one of the buffer layer and the fin structure comprises silicon germanium having a first silicon-to-germanium component ratio other than a second silicon-to-germanium component ratio of the other of the buffer layer and the fin structure. In another embodiment another embodiment, the line of discontinuity forms an edge of a depression, wherein a height of the depression is at least 0.5 nanometers. In another embodiment, an overall thickness of both the first spacer portion and the second spacer portion is in a range of 0.5 nanometers (nm) to 15 nm.

In another implementation, a method comprises forming a gate structure of a transistor, wherein the gate structure extends over a fin structure disposed on a buffer layer including a semiconductor lattice, depositing a first spacer portion on a sidewall of the gate structure, after depositing the first spacer portion, forming a second spacer portion which adjoins the first spacer portion, and forming in the fin structure a source or drain region of the transistor. A stress is imposed on the channel region of the transistor with the buffer layer, wherein a line of discontinuity is formed on the fin structure at an interface of the first spacer portion and the second spacer portion, or the second spacer portion and the source or drain region each include a dopant, wherein a concentration of the dopant in the second spacer portion is greater than a concentration of the dopant in the source or drain region.

In an embodiment, forming the source or drain region includes, after depositing the first spacer portion, forming a doped epitaxial layer on the fin structure, and performing an indiffusion from the doped epitaxial layer into the fin structure. In another embodiment, forming the source or drain region includes, after forming the first spacer portion, depositing a doped glass material on the fin structure, and performing an indiffusion from the doped glass material into the fin structure. In another embodiment, the concentration of the dopant in the second spacer portion is greater than the concentration of the dopant in the source or drain region, and wherein forming the source or drain region includes performing an indiffusion from the doped material into the fin structure. In another embodiment, forming the source or drain region further comprises, after depositing the first spacer portion, forming a doped layer on the fin structure, and before forming the second spacer portion, performing an indiffusion from the doped layer into the fin structure.

In another embodiment, forming the source or drain region includes after forming the first spacer portion and before forming the second spacer portion, performing an ion implantation of the fin structure. In another embodiment, forming the source or drain region includes after forming the first spacer portion and before forming the second spacer portion, performing a plasma implantation of the fin structure. In another embodiment, one of the buffer layer and the fin structure comprises silicon germanium having a first silicon-to-germanium component ratio other than a second silicon-to-germanium component ratio of the other of the buffer layer and the fin structure. In another embodiment, the line of discontinuity forms an edge of a depression, wherein a height of the depression is at least 0.5 nanometers. In another embodiment, wherein an overall thickness of both the first spacer portion and the second spacer portion is in a range of 0.5 nanometers (nm) to 15 nm.

In another implementation, a system comprises an integrated circuit (IC) device comprising a buffer layer including a semiconductor lattice, a fin structure disposed on the buffer layer, the fin structure including a channel region of a transistor and a source or drain region of the transistor, wherein a stress is imposed on the channel region with the buffer layer, a gate structure of the transistor, wherein the gate structure extends over the fin structure, a first spacer portion disposed on a sidewall of the gate structure, and a second spacer portion adjoining the first spacer portion. A line of discontinuity is formed on the fin structure at an interface of the first spacer portion and the second spacer portion, or the second spacer portion and the source or drain region each include a dopant, wherein a concentration of the dopant in the second spacer portion is greater than a concentration of the dopant in the source or drain region. The system further comprises a display device coupled to the IC device, the display device to display an image based on a signal communicated with the IC device.

In an embodiment, the surface of the fin structure forms the line of discontinuity, wherein the line of discontinuity defines at least in part a recess portion under the first spacer portion. In another embodiment, the surface of the fin structure forms the line of discontinuity, wherein the line of discontinuity defines at least in part a recess portion under the second spacer portion. In another embodiment, the concentration of the dopant in the second spacer portion is greater than the concentration of the dopant in the source or drain region, and the line of discontinuity is formed on the fin structure at the interface.

In another embodiment, the line of discontinuity is formed on the fin structure at the interface of the first spacer portion and the second spacer portion, or a concentration of a dopant in the second spacer portion is greater than a concentration of the dopant in the source or drain region. In another embodiment, one of the buffer layer and the fin structure comprises silicon germanium having a first silicon-to-germanium component ratio other than a second silicon-to-germanium component ratio of the other of the buffer layer and the fin structure. In another embodiment, the line of discontinuity forms an edge of a depression, wherein a height of the depression is at least 0.5 nanometers. In another embodiment, an overall thickness of both the first spacer portion and the second spacer portion is in a range of 0.5 nanometers (nm) to 15 nm.

Techniques and architectures for promoting stress in a transistor are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) device comprising:
a buffer layer including a semiconductor lattice;
a fin structure which extends along a first dimension from the buffer layer, the fin structure including:
a channel region of a transistor, wherein a stress is imposed on the channel region with the buffer layer; and
a doped source or drain region of the transistor, wherein the doped source or drain region extends to a surface of the fin structure;
a gate structure of the transistor, wherein the gate structure extends over the fin structure;
a first spacer portion disposed on a sidewall of the gate structure;
a second spacer portion adjoining the first spacer portion; and
a residual doped layer portion on the surface of the fin structure, wherein, along a first line in the first dimension, the residual doped layer portion is between, and adjoins each of, the second spacer portion and the doped source or drain region;
wherein the first spacer portion extends along a second line in the first dimension, past a bottom of the second spacer portion and along the residual doped layer portion, to adjoin the doped source or drain region at the surface of the fin structure; and
wherein, at the surface of the fin structure, the doped source or drain region extends, away from the first spacer portion and along a third line of direction in a second dimension which is orthogonal to the first dimension, under the residual doped layer portion, and then past an edge of the residual doped layer portion.

2. The IC device of claim 1, wherein one of the buffer layer and the fin structure comprises silicon germanium having a first silicon-to-germanium component ratio other than a second silicon-to-germanium component ratio of the other of the buffer layer and the fin structure.

3. The IC device of claim 1, wherein respective bottom edges of the first spacer portion and the second spacer portion form an edge of a depression, wherein a height of the depression is at least 0.5 nanometers.

4. The IC device of claim 1, wherein an overall thickness of both the first spacer portion and the second spacer portion is in a range of 0.5 nanometers (nm) to 15 nm.

5. A method comprising:
forming a gate structure of a transistor, wherein the gate structure extends over a fin structure which extends along a first dimension from a buffer layer including a semiconductor lattice;
depositing a first spacer portion on a sidewall of the gate structure;
after depositing the first spacer portion, forming a doped layer on the fin structure, wherein the first spacer portion extends to a surface of the fin structure;
after forming the doped layer on the fin structure, forming a second spacer portion which adjoins the first spacer portion;
performing an indiffusion, from the doped layer into the fin structure, to form a source or drain region of the transistor, wherein the doped source or drain region extends to the surface of the fin structure; and
after performing the indiffusion, performing an etch to remove a portion of the doped layer to expose the source or drain region;
wherein, after the etch:
a residual second portion of the doped layer remains on the fin structure, wherein, along a first line in the first dimension, the residual doped layer portion is between, and adjoins each of, the second spacer portion and the doped source or drain region;
the first spacer portion extends along a second line in the first dimension, past a bottom of the second spacer portion and along the residual doped layer portion, to adjoin the doped source or drain region at the surface of the fin structure; and
a stress is imposed on a channel region of the transistor with the buffer layer.

6. The method of claim 5, wherein forming the doped layer on the fin structure comprises forming a doped epitaxial layer.

7. The method of claim 5, wherein forming doped layer on the fin structure comprises depositing a doped glass material on the fin structure.

8. The method of claim 5, wherein one of the buffer layer and the fin structure comprises silicon germanium having a first silicon-to-germanium component ratio other than a second silicon-to-germanium component ratio of the other of the buffer layer and the fin structure.

9. The method of claim 5, wherein respective bottom edges of the first spacer portion and the second spacer portion form an edge of a depression, wherein a height of the depression is at least 0.5 nanometers.

10. The method of claim 5, wherein an overall thickness of both the first spacer portion and the second spacer portion is in a range of 0.5 nanometers (nm) to 15 nm.

11. A system comprising:
an integrated circuit (IC) device comprising:
a buffer layer including a semiconductor lattice;
a fin structure which extends along a first dimension from the buffer layer, the fin structure including:
a channel region of a transistor, wherein a stress is imposed on the channel region with the buffer layer; and
a doped source or drain region of the transistor, wherein the doped source or drain region extends to a surface of the fin structure;
a gate structure of the transistor, wherein the gate structure extends over the fin structure;
a first spacer portion disposed on a sidewall of the gate structure;
a second spacer portion adjoining the first spacer portion; and
a residual doped layer portion on the surface of the fin structure, wherein, along a first line in the first dimension, the residual doped layer portion is between, and adjoins each of, the second spacer portion and the doped source or drain region;
wherein the first spacer portion extends along a second line in the first dimension, past a bottom of the second spacer portion and along the residual doped layer portion, to adjoin the doped source or drain region at the surface of the fin structure; and wherein, at the surface of the fin structure, the doped source or drain region extends, away from the first spacer portion and along a third line of direction in a second dimension which is orthogonal to the first dimension, under the residual doped layer portion, and then past an edge of the residual doped layer portion; and a display device coupled to the IC device, the display device to display an image based on a signal communicated with the IC device.

\* \* \* \* \*